(12) United States Patent
McKisson (10) Patent No.: US 10,541,660 B2
(45) Date of Patent: Jan. 21, 2020

(54) PASSIVE BIAS TEMPERATURE COMPENSATION CIRCUIT MODULE

(71) Applicant: JEFFERSON SCIENCE ASSOCIATES, LLC, Newport News, VA (US)

(72) Inventor: John E. McKisson, Williamsburg, VA (US)

(73) Assignee: JEFFERSON SCIENCE ASSOCIATES, LLC, Newport News, VA (US)

( * ) Notice: Subject to any disclaimer, the term of this patent is extended or adjusted under 35 U.S.C. 154(b) by 246 days.

(21) Appl. No.: 15/792,437

(22) Filed: Oct. 24, 2017

(65) Prior Publication Data

US 2018/0115290 A1 Apr. 26, 2018

Related U.S. Application Data

(60) Provisional application No. 62/412,495, filed on Oct. 25, 2016.

(51) Int. Cl.
*H03G 3/20* (2006.01)
*H05K 1/18* (2006.01)
(Continued)

(52) U.S. Cl.
CPC .................. *H03G 3/20* (2013.01); *G01J 1/44* (2013.01); *H01C 7/008* (2013.01); *H03G 1/0041* (2013.01); *H03G 3/3084* (2013.01); *H05K 1/185* (2013.01); *H05K 3/30* (2013.01); *G01J 2001/444* (2013.01); *H03G 2201/708* (2013.01); *H05K 1/186* (2013.01); *H05K 2201/1006* (2013.01); *H05K 2201/10015* (2013.01); *H05K 2201/10022* (2013.01); *H05K 2201/10151* (2013.01); *H05K 2201/10219* (2013.01); *H05K 2201/10515* (2013.01); *H05K 2201/10522* (2013.01)

(58) Field of Classification Search
CPC .. H05K 1/185; H05K 3/30; H03G 3/20; G01J 1/44; H01C 7/008
USPC ...................................................... 250/214 C
See application file for complete search history.

(56) References Cited

U.S. PATENT DOCUMENTS

5,548,112 A 8/1996 Nakasi et al.
5,578,815 A 11/1996 Nakasi et al.
(Continued)

*Primary Examiner* — Kevin K Pyo (57) ABSTRACT

A passive bias temperature compensation module for silicon photomultiplier, avalanche photodiodes and similar photodetectors that possess a moderately linear temperature coefficient of gain and that may be compensated by varying an applied bias voltage. The module includes an electrical circuit and a method for determining component values to provide a constant voltage source to stabilize the gain of one or more photodetector devices. A temperature sensor in the module is held in close thermal contact with the photodetector and a filter capacitor is electrically close to the photodetector. The module is based on the concept of temperature sensitive voltage division which is applicable to situations in which large numbers of photodetectors must be gain-compensated for temperature variations over a wide range while maintaining excellent gain matching. The passive bias temperature compensation method enables multiple photodetectors to share a single constant voltage supply without loss of matching performance.

10 Claims, 7 Drawing Sheets

(51) Int. Cl.

| | |
|---|---|
| *H01C 7/00* | (2006.01) |
| *H05K 3/30* | (2006.01) |
| *G01J 1/44* | (2006.01) |
| *H03G 3/30* | (2006.01) |
| *H03G 1/00* | (2006.01) |

(56) References Cited

U.S. PATENT DOCUMENTS

| | | |
|---|---|---|
| 7,468,920 B2 | 12/2008 | Sekar et al. |
| 7,583,539 B2 | 9/2009 | Sekar et al. |
| 7,812,587 B2 | 10/2010 | Suzuki et al. |
| 7,852,136 B2 | 12/2010 | Bettencourt |
| 8,559,898 B2 | 10/2013 | Jones et al. |
| 8,811,921 B2 | 8/2014 | Jones et al. |
| 8,983,407 B2 | 3/2015 | Southcombe et al. |
| 9,123,611 B1* | 9/2015 | McKisson ................ G01J 1/00 |
| 9,634,156 B2 | 4/2017 | Pavlov et al. |
| 2006/0290366 A1* | 12/2006 | Kon ................ G01R 31/2874 |
| | | 324/750.06 |

* cited by examiner

PASSIVE BIAS TEMPERATURE COMPENSATION CIRCUIT MODULE

CROSS-REFERENCE TO RELATED APPLICATIONS

This application claims the benefit of Provisional U.S. Patent Application Ser. No. 62/412,495 filed Oct. 25, 2016, the contents of which are incorporated herein by their entirety.

GOVERNMENT LICENSE RIGHTS STATEMENT

The United States Government may have certain rights to this invention under Management and Operating Contract No. DE-AC05-06OR23177 from the Department of Energy.

FIELD OF THE INVENTION

The invention relates to a passive method for providing gain compensation for silicon photomultiplier, APD and similar devices that possess a moderately linear temperature coefficient of gain and that may be compensated by varying an applied bias voltage.

BACKGROUND OF THE INVENTION

Existing methods for managing the variations in gain due to the temperature dependence in so-called silicon photomultiplier (SiPM) and avalanche photo detector (APD) devices typically include one or more microprocessors. In some situations, a temperature sensor is included for read out by the microprocessor(s) which in turn actively controls either the bias supply or a variable gain amplifier stage.

In systems where a large number of devices require compensation the approaches using such microprocessor control are not practical. In these larger systems the problems with implementing tight gain matching in temperature become difficult and costly with the active compensation approaches. Complicating matters the photodetectors are unlikely to all be at the same temperature, so any small number of temperature sensors may not sufficiently sample the photodetector temperatures. Additionally, the higher power requirement and thermal load of a multiplicity of active temperature sensors and the associated bias control circuitry may exceed the power available or contribute to the thermal load further exacerbating the problem.

Accordingly, what is needed is a simpler and less costly device and method for managing the variations in gain due to the temperature dependence in silicon photomultiplier (SiPM) and avalanche photo detector (APD) devices.

OBJECT OF THE INVENTION

The object of the invention is to provide a passive bias temperature compensation circuit module that manages the variations in gain due to the temperature dependence in silicon photomultiplier (SiPM) and avalanche photo detector (APD) devices.

Another object is to provide the temperature compensation without the need for active circuit elements.

A further object is to provide a temperature compensation circuit module that assures that the required sensor is thermally close to the SiPM and that the required filter capacitor is electrically close to the SiPM.

Yet another object is to provide a temperature compensation circuit module that simplifies additional circuitry by encapsulating the three invariant components within.

These and other objects and advantages of the present invention will be better understood by reading the following description along with reference to the drawings.

SUMMARY OF THE INVENTION

The invention is a passive bias temperature compensation apparatus and method for silicon photomultiplier (SiPM), avalanche photodiodes (APD) and similar devices that possess a moderately linear temperature coefficient of gain and that may be compensated by varying an applied bias voltage. The method includes a module housing an electrical circuit that is attached in thermal contact with the photodetector and to a motherboard with an additional electrical circuit. The invention further includes a method for determining component values so that a constant voltage source and passive components can be used to stabilize the gain of one or more SiPM or APD devices with a single, constant voltage supply. The passive bias temperature compensation method is based on the concept of temperature sensitive voltage division which is applicable to situations in which large numbers of photodetectors must be gain-compensated for temperature variations over a wide range while maintaining excellent gain matching. Various embodiments enable multiple photodetectors to share a single constant voltage power supply without loss of matching performance.

DETAILED DESCRIPTION OF THE INVENTION

The present invention is a passive method for providing gain compensation for silicon photomultiplier, APD and similar devices that possess a moderately linear temperature coefficient of gain and that may be compensated by varying an applied bias voltage. As described herein the invention includes a circuit and a method for determining component values so that a constant voltage source and passive components can be used to stabilize the gain of one or more SiPM or APD devices with a single, constant voltage supply. Based on the concept of temperature sensitive voltage division this approach is well suited to situations in which large numbers of photodetectors must be gain compensated over a wide range maintaining excellent gain matching. A variant of the circuit allows multiple photodetectors to share a single constant voltage power supply without loss of matching performance.

The meaning of the term "passive" as used herein describes a portion of a circuit in which the charge carriers flowing through the circuit do not have their energy level increased. The only energy level changes are dissipative losses. The bias compensation circuit described herein is passive in the way it provides an appropriate bias voltage to the photodetector.

The meaning of the term "electrically close" as used herein is defined as providing electrical interconnections that minimize inductance and resistance that would otherwise worsen the time response and therefore reduce the effectiveness of a capacitor intended to rapidly provide restoring charge to a circuit element.

The meaning of the term "thermally close" as used herein is defined as providing means through either or both materials and/or physical proximity that minimize temperature differences between two items at equilibrium and assure a minimal time lag in temperature differences during thermal transients.

The meaning of the term "moderately linear" as used herein is defined as regions along a curve which may be approximated by a straight line within acceptable error.

The meaning of the term "wafer" as used herein is defined as a thin assembly of insulating and conducting materials with components.

The meaning of the term "embedded component manufacturing technique" as used herein is defined as a PCB fabricating technique or manufacturing technology in which multiple layers of a printed circuit board contain components such as resistors and capacitors included during PCB fabrication, typically done to achieve electrically close component placement.

The meaning of the term "trimming resistor" as used herein is defined as a resistor arrangement in which two or more resistors are included in a circuit in order to obtain a final equivalent resistance that is closer to the desired ideal than would otherwise be available from standard component values.

The current invention provides a detector module, in which one or more reasonably matched photodetector elements are mounted in thermal contact with a temperature sensor and several of the compensation components in a module that minimizes the complexity and optimizes thermal coupling between photodetector and temperature sensor.

The thermally-compensated SiPM module of the present invention utilizes portions of a method patented in U.S. Pat. No. 9,123,611, in which a compact thermally-compensated detector module assembles a SiPM or similar detector with a temperature sensor and additional circuitry to create an independently-compensated photodetector with a temperature sensor in thermal proximity to the photodetector.

Figure 1:
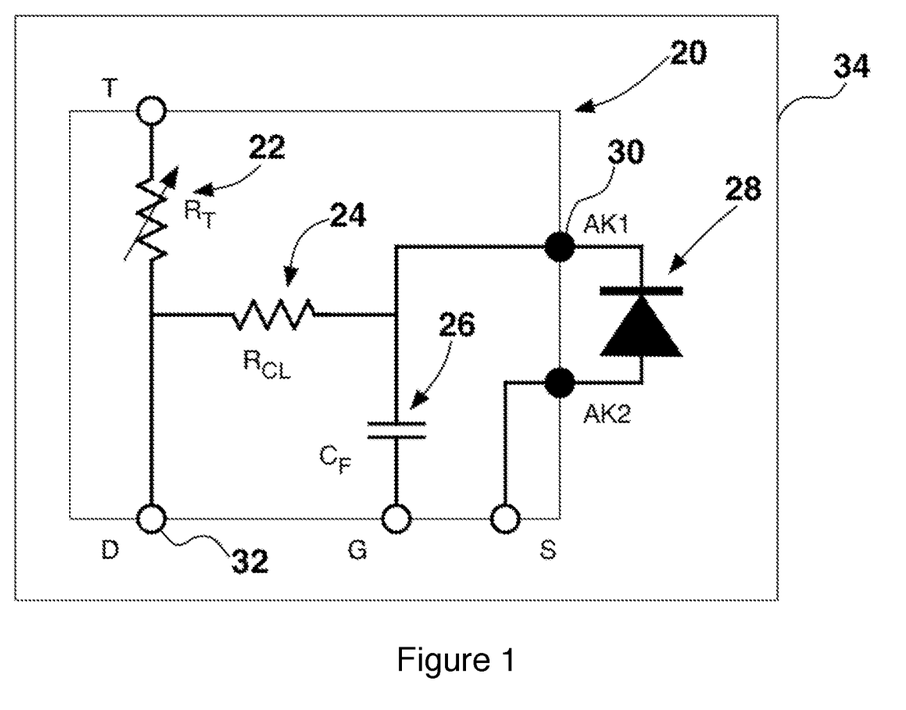
FIG. 1 is an electrical circuit diagram of a thermally-compensated silicon photomultiplier SiPM module for providing gain compensation for silicon photomultiplier, APD and similar devices that possess a moderately linear temperature coefficient of gain and that may be compensated by varying an applied bias voltage.

With reference to FIG. 1, a first embodiment of a thermally-compensated silicon photomultiplier SiPM module 20 according to the present invention includes closed circles representing top contacts of the module that connect to the SiPM device mounted above, while open circles represent bottom contacts of the module intended for connection to additional electrical circuitry. The temperature compensated module 20 includes a thermistor 22, a current limiting resistor 24, and a filter capacitor 26 arranged to assure close thermal coupling between the thermistor 22 and the SiPM photodetector 28 as well as close electrical coupling between the filter capacitor 26 and the SiPM photodetector 28. Variations in the design of the module 20 would allow various sizes of surface mount and through-hole mounted SiPM devices to be attached.

In a specific implementation of the module, a wafer is fabricated using embedded component PCB fabrication techniques to produce a thin (~1 mm) module 20 with two contacts 30 (closed circles) on the top of the module 20 for connection of the SiPM 28 and four leadless contacts 32 (open circles) on the bottom of the module 20. The outline of the module 20 is constructed to match the outline of the original SiPM sensor, thus requiring no additional PCB area and allowing close spacing of detector elements if desired. With the SiPM 28 assembled to the top of the module, the module 20 is then mounted to another PCB, such as a motherboard 34, for the additional connections and mechanical positioning. Additional circuitry to complete the temperature compensation module would be placed on the motherboard 34. It is critical that the thermistor 22 is placed in thermal contact with the SiPM 28, (i.e. thermal contact by conduction) as the closer they are to the same temperature the better will be the temperature compensation for the SiPM. In addition to assuring the thermal sensor is in close thermal contact with the SiPM, the module 20 provides modest thermal isolation between the SiPM and the motherboard 34. An RC filter is internal to the module consisting of the current limiting resistor 24 and capacitor 26. The RC filter thus formed removes residual noise from the applied voltage, stores sufficient charge so the SiPM 28 signal retains its full amplitude, and provides charge to recharge the SiPM after it quenches.

Figure 2:
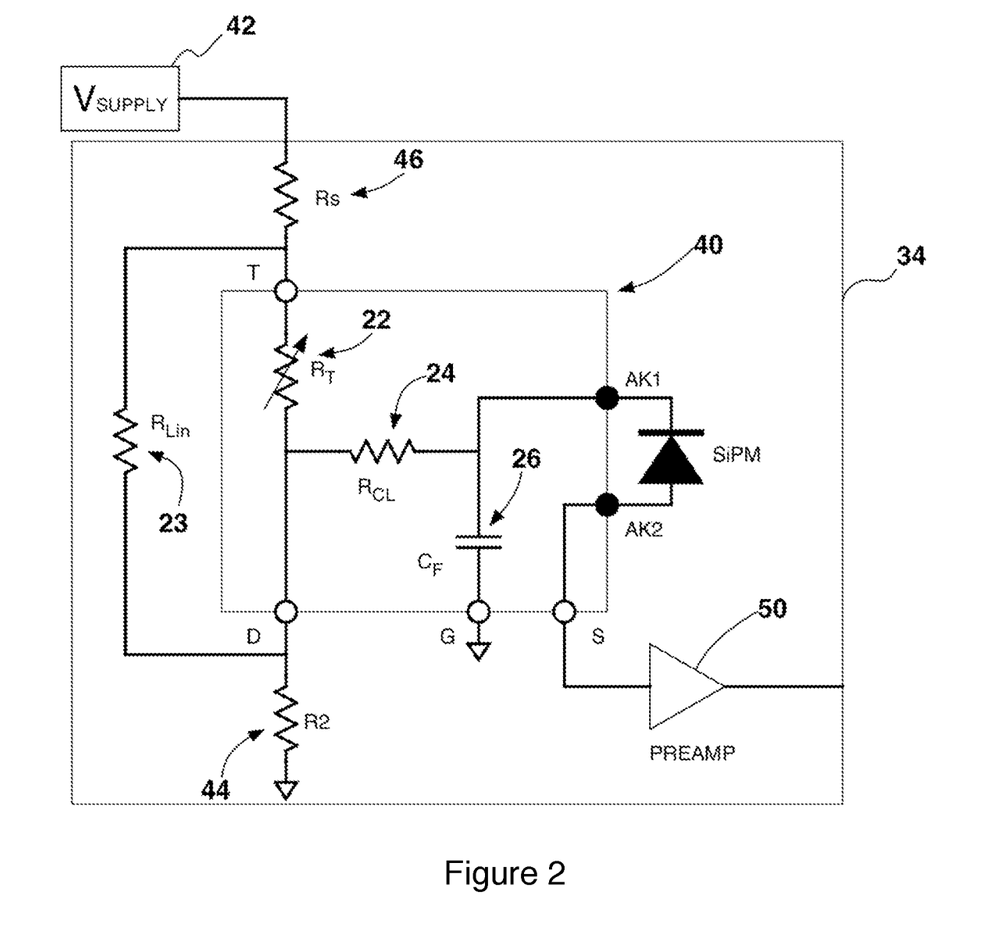
FIG. 2 is an electrical circuit diagram depicting how a thermally-compensated silicon photomultiplier SiPM module can be implemented with a negative temperature coefficient thermistor and positive bias. This figure includes the additional components located external to the module on the mother board and suggests that the bias power supply may not necessarily be located on the mother board.
Figure 3:
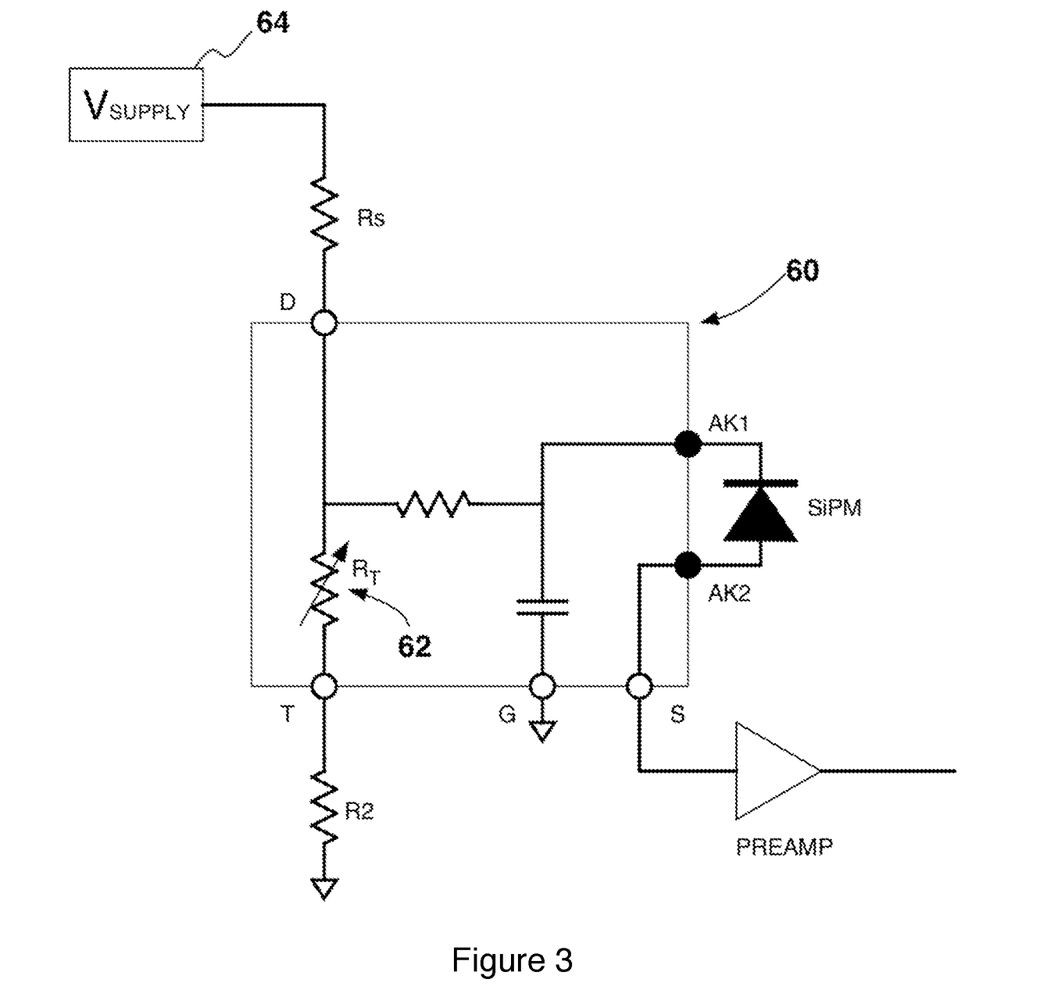
FIG. 3 is an electrical circuit diagram depicting an example of how the thermally-compensated silicon photomultiplier SiPM module can also be used with a positive temperature coefficient temperature sensor with a positive bias supply.

Referring to FIG. 2, a second embodiment of the thermally-compensated silicon photomultiplier SiPM module 40 is shown implemented with additional circuitry including a negative temperature coefficient thermistor 22, a linearizing resistor 23 with value $R_{Lin}$ and a positive bias 42. The nominal operating voltage range of the sensors and the expected temperature range of operation drive the selection of thermistor 22 and the value of the linearizing resistor 24 that may be connected outside the module 40. The procedure described U.S. Pat. No. 9,123,611 would be followed to determine the values. The linearizing resistor $R_{Lin}$ 23 is added to the module 40 in order to linearize the output of the negative temperature coefficient thermistor 22. Positive temperature coefficient thermistors, such as shown in FIG. 3, tend to be much closer to linear and would not require the linearizing resistor.

The components depicted in FIG. 2 include a divider resistor 44, which may include trimming resistors, the linearizing resistor $R_{Lin}$ 23, and the optional source resistor 46 that would be required if multiple sensors are to share the same bias supply voltage. Also shown are the bias supply 42 and a transimpedance amplifier connection 50.

Terminal identification in the Figures includes follows:
T: Thermistor in ("top" connection to thermistor $R_T$)
D: Divider out ("bottom" connection to thermistor $R_T$, current limiting resistor $R_{CL}$)
AK1: SiPM anode/cathode-in
AK2: SiPM anode/cathode-out
S: Signal from SiPM to amplifier
G: Ground (bottom of filter capacitor $C_F$)

The passive bias temperature compensation circuit module may be used in several other configurations perhaps with different sensor types including the use of positive temperature coefficient thermal sensors, connections for negative bias supplies and alternative connections to amplifiers and preamplifiers. Note that platinum resistance devices while possessing a positive temperature coefficient and much more linear characteristic than the negative TCR manganese oxide devices are often limited to smaller nominal resistance values and so may be less practical in these applications.

As shown in FIG. 3, a third embodiment of the passive bias temperature compensation module 60 includes a positive temperature coefficient thermistor 62 with a positive bias supply 64.

Figure 4:
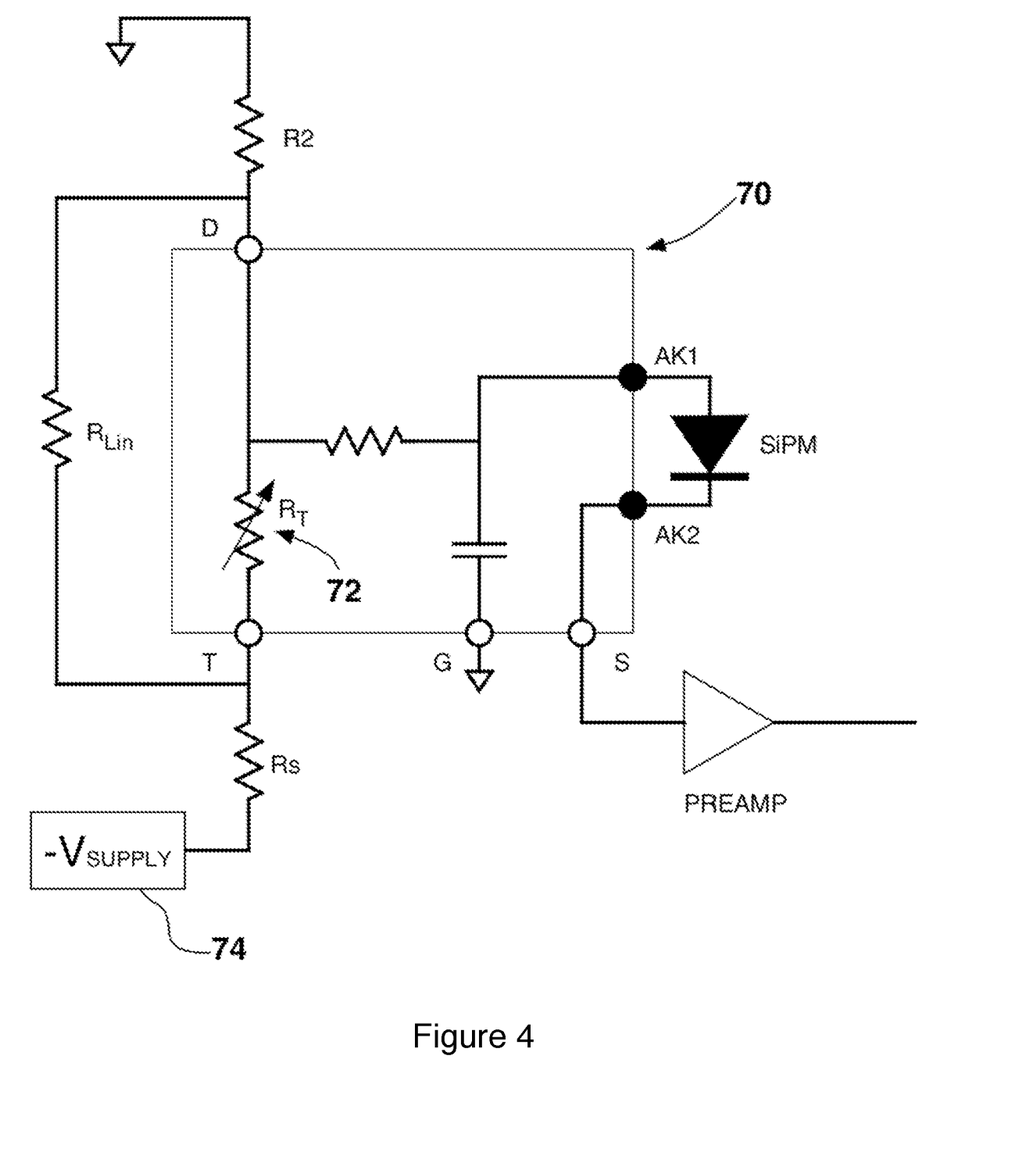
FIG. 4 shows an example of how the module can also be used with a positive temperature coefficient temperature sensor and a negative bias supply.

With reference to FIG. 4, a fourth embodiment of the passive bias temperature compensation module 70 includes a positive temperature coefficient thermistor 72 and a negative bias supply 74.

Figure 5:
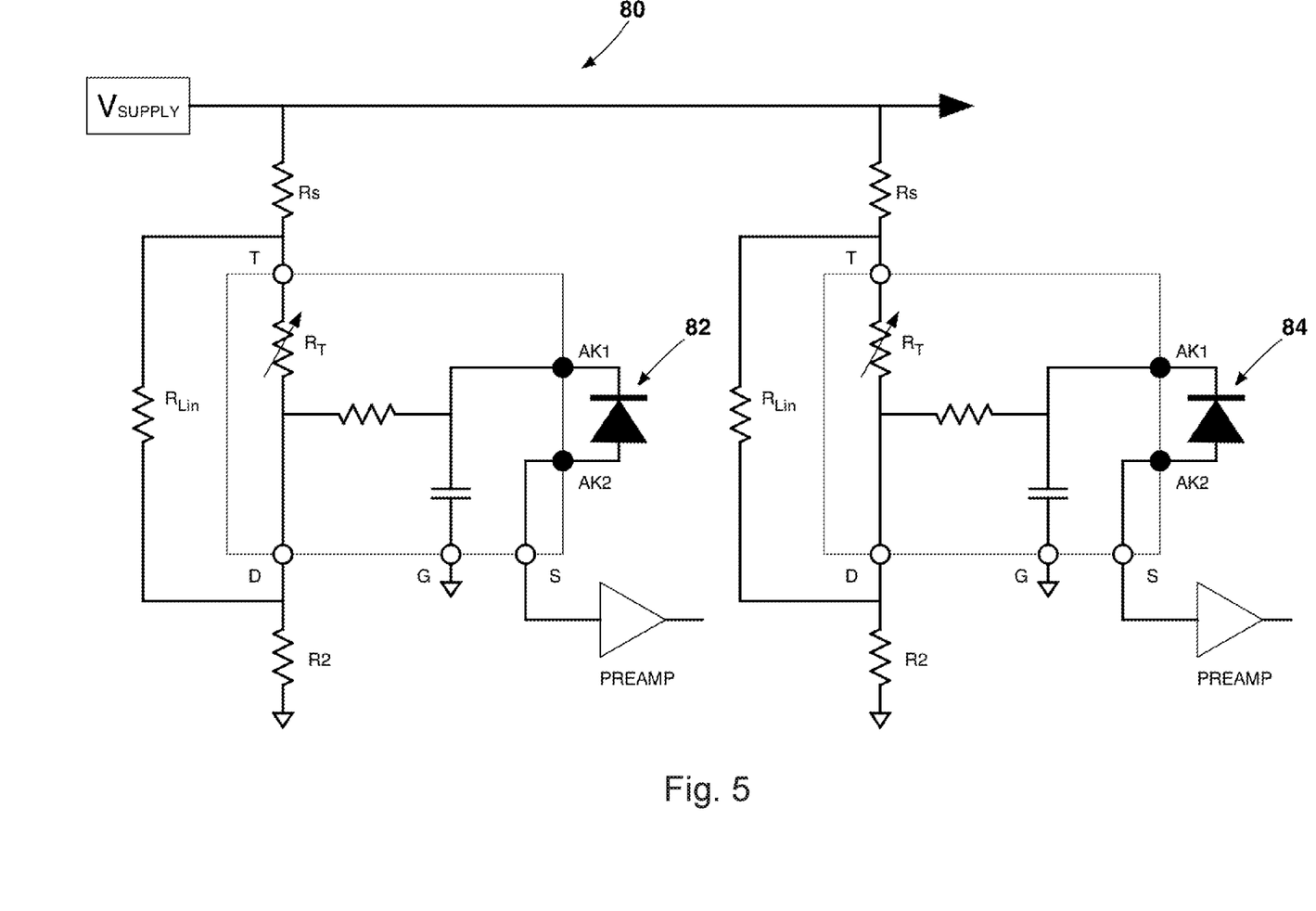
FIG. 5 shows one example of a circuit that allows multiple photodetectors using the thermally-compensated silicon photomultiplier SiPM module to share a single bias supply.

With reference to FIG. 5, a fifth embodiment of the passive bias temperature compensation module 80 depicts an example of a module having a circuit that allows multiple photodetectors 82, 84 to share a single bias supply 86.

Referring to FIG. 2, utilizing the method of U.S. Pat. No. 9,123,611 in order to realize appropriate temperature compensation the divider resistor 44, linearized thermistor 22 and 23, and bias supply 42 must satisfy two relationships:
(1) $V_{OP}$ at operating temperature T $$V_{OP} = \frac{R_2\left[V_{SUPPLY} - I_{Leak}\left|\frac{R_{Lin}R_{T_0}e^{B_0\left(\frac{1}{T}-\frac{1}{T_0}\right)}}{R_{Lin} + R_{T_0}e^{B_0\left(\frac{1}{T}-\frac{1}{T_0}\right)}}\right|\right]}{R_2 + \frac{R_{Lin}R_{T_0}e^{B_0\left(\frac{1}{T}-\frac{1}{T_0}\right)}}{R_{Lin} + R_{T_0}e^{B_0\left(\frac{1}{T}-\frac{1}{T_0}\right)}}}$$

and
(2) Temperature Coefficient of Voltage (TCV) of the linearized thermistor evaluated at operating temperature T $$TCV = \frac{B_0 R_{T_0}^2 R_{Lin} e^{2B_0\left(\frac{1}{T}-\frac{1}{T_0}\right)}}{T^2\left[R_{Lin} + R_{T_0}e^{B_0\left(\frac{1}{T}-\frac{1}{T_0}\right)}\right]^2} - \frac{B_0 R_{T_0} R_{Lin} e^{B_0\left(\frac{1}{T}-\frac{1}{T_0}\right)}}{T^2\left[R_{Lin} + R_{T_0}e^{B_0\left(\frac{1}{T}-\frac{1}{T_0}\right)}\right]}$$

Where
TCV=Temperature Coefficient of Voltage (V/K)
T=Temperature for circuit operation (K)
$V_{SUPPLY}$=Bias supply voltage (V)
$I_{Leak}$=Device leakage current (A)
$R_{Lin}$=Resistance of linearizing resistor, placed in parallel with the thermistor (Ω)

$R_2$=Resistance of divider resistor (Ω)
$T_0$=Thermistor reference temperature (K)
$R_{T_0}$=Thermistor resistance at reference temperature $T_0$ (K)
$B_0$=Beta characteristic parameter for thermistor (K)

The operating temperature T is not necessarily in the center of the operating range. This temperature can be any temperature within the range, and is often selected as the most likely temperature but may also be selected to provide a best fit of the final solution.

With the two conditions of operating voltage and voltage coefficient of temperature satisfied, the temperature compensation voltage divider will provide the proper bias voltage at temperature and will then vary the applied bias as the temperature varies with a slope that is nearly equal to the slope of the gain change in temperature. In this way the circuit will maintain the gain at the selected value within an acceptable error.

Operating Groups of Detector Devices from a Single $V_{SUPPLY}$ Source

Whereas the TCG is nearly invariant between devices of a particular manufacture, the operating voltage ($V_{OP}$) of each SiPM varies over several hundred percent of the control range. It is necessary to provide a stabilized voltage value to each individual circuit. This can be impractical for any large array with a large number of SiPM devices.

The method described here allows the use of a three-resistor voltage divider to achieve correct slope and intercept for a range of device operating voltages while requiring only a single input voltage for the bias voltage divider for a large number (group) of circuits. The approach here is then to gather devices with similar characteristics and operate each group from a common $V_{SUPPLY}$ voltage, thus minimizing the number of supplies necessary.

The addition of a source resistor 46 having source resistance $R_S$ provides an offset to allow operation of the two-resistor voltage divider with a wider range of input voltages. This is the design element that allows the use of a much smaller subset of supply voltage values shared within a group of detector devices where a two-resistor voltage divider would require many times more distinct values to achieve both slope and intercept for the same number of detector devices.

For the case with a third resistor the output voltage condition becomes:
(3)

$$V_{OP} = \frac{R_2\left[V_{SUPPLY} - I_{Leak}\left[\left[\frac{R_{Lin}R_{T_0}e^{B_0\left(\frac{1}{T}-\frac{1}{T_0}\right)}}{R_{Lin} + R_{T_0}e^{B_0\left(\frac{1}{T}-\frac{1}{T_0}\right)}}\right] + R_S\right]\right]}{R_S + R_2 + \frac{R_{Lin}R_{T_0}e^{B_0\left(\frac{1}{T}-\frac{1}{T_0}\right)}}{R_{Lin} + R_{T_0}e^{B_0\left(\frac{1}{T}-\frac{1}{T_0}\right)}}}$$

and the TCV condition that must be met becomes:
(4)

$$TCV = -\frac{R_2\left[V_{SUPPLY} - I_{Leak}\left[\frac{R_{Lin}U}{R_{Lin} + U}\right]\right]\left[\frac{B_0 R_{Lin} U^2}{T^2[R_{Lin} + U]^2} - \frac{B_0 R_{Lin} U}{T^2[R_{Lin} + U]}\right]}{\left[R_2 + \frac{R_{Lin}U}{R_{Lin} + U}\right]^2} -$$

$$I_{Leak} R_2 \left[ \frac{B_0 R_{Lin} U^2}{T^2[R_{Lin} + U]^2} - \frac{B_0 R_{Lin} U}{T^2[R_{Lin} + U]} \right]$$
$$\overline{\left[ R_2 + \frac{R_{Lin} U}{R_{Lin} + U} \right]}$$

Where $U = R_{T_0} e^{B_0\left(\frac{1}{T} - \frac{1}{T_0}\right)}$

With the addition of this source resistance $R_S$ a solution set can be found for a group of SiPM devices that requires only a single stabilized voltage source value.

Summary of Method for Passively Compensating for Temperature Gain

The method for passively compensating for temperature coefficient of gain in a system including a plurality of multiple pixel avalanche photo detector devices, described hereinabove, results in a typically unique set of exact value resistors ($R_S$ and $R_2$) for every SiPM device operating voltage ($V_{OP}$) within a manufacturing lot. In practice some error may be tolerated so that similar devices (that is, SiPM devices with similar $V_{OP}$ characteristics) may have identical resistor solutions.

A variation of the method is applicable which presumes a small subset of fixed input voltage values which can then reduce the number of trimming resistors required. The number of devices in a group that can be supplied by a single $V_{SUPPLY}$ depends on the variation of $V_{OP}$ and the overall number of devices to be powered. Larger groups or those with larger variations will result in reduced performance in matching TCV.

To further minimize costs, the well-known technique of employing binary weighted trim resistors is also assumed that allows a set of resistors (chosen from standard value sets) to be assembled identically for each SiPM device in large set, and then jumpers selected to adjust the total resistance values as required to meet the $V_{OP}$ for each individual device. This approach minimizes cost of fabrication and assembly at the cost of a simple calibration step at final assembly.

These two techniques (input voltages and resistor trimming) can be applied in different measures (weights) depending on the restrictions of the application and the desired errors allowable for gain stabilization.

The method of calculation and analysis that allows design of a three-resistor temperature sensitive voltage divider bias compensation circuit that provides for a reasonably and arbitrarily small set of supply voltages to be used to achieve gain compensation and matching of both slope and intercept of the compensation to within errors of the component tolerances chosen includes the following steps:

1. Determine the Temperature Coefficient of Gain (TCG) for the devices
2. Either directly, or from the TCG and the Gain/Voltage relationship for the devices, determine the Temperature Coefficient of Voltage (TCV) that will compensate the TCG.
3. Select an Input Voltage $V_{SUPPLY}$ greater than the highest $V_{OP}$ for all devices. How much greater is determined by the divider current which is generally a function of the thermistor characteristic. Initial iterations may be required to discover a suitable selection.
4. Select a thermistor with characteristics $R_{T0}$ (often R at 25° C.), $T_0$ (often 25° C.) and $B_0$ (Thermistor Beta characteristic at range of temperatures of interest). Specifically a negative temperature coefficient thermistor, such as a manganese oxide thermistor (MnO) is used.

5. Select a linearizing resistor $R_{Lin}$ that minimizes non-linearity of the parallel combination at the operating temperature T so that a best choice tradeoff is made over desired range of temperatures. This selection process may be approached in a variety of ways. Minimizing a set of weighted errors across the operating temperature range is often sufficient.

6. Using the equation below, determine current $I_0$ through the linearized thermistor combination that will result in the desired TCV at the temperature of interest $T_0$. Note that this current would also include the device leakage current if it is significant with respect to the total current.

(5)

$$I_0 = \frac{-TCV_{desired}}{\left[ \frac{B_0 R_{Lin} U^2}{T^2[R_{Lin} + U]^2} - \frac{B_0 R_{Lin} U}{T^2[R_{Lin} + U]} \right]} \tag{5}$$

Where $U = R_{T_0} e^{B_0\left(\frac{1}{T} - \frac{1}{T_0}\right)}$ $T$ = Temperature for circuit operation (K)

7. Determine the exact value of $R_2$ that will result in the correct $V_{OP}$ at the temperature of interest from thermistor current $I_0$ found in step 6 above. Because the current in the linearized thermistor would also include leakage current that does not pass through $R_2$ the leakage current is subtracted here.

(6)

$$R_2 = \frac{V_{OP}}{I_0 - I_{Leak}} \tag{6}$$

8. Determine the exact value for $R_S$ that will result in the sum of voltage drops across $R_S$, the linearized thermistor and $R_2$ to equal the supply voltage $V_{SUPPLY}$.

(7)

$$R_S = \frac{V_{SUPPLY} - V_{OP}}{I_0} - \frac{R_{Lin} R_{T_0} e^{B_0\left(\frac{1}{T} - \frac{1}{T_0}\right)}}{R_{Lin} + R_{T_0} e^{B_0\left(\frac{1}{T} - \frac{1}{T_0}\right)}} \tag{7}$$

9. Select approximate values for $R_2$ and for $R_S$ from available resistors, or construct resistor combination to more closely approximate the exact values.

10. Repeat steps 7 through 9 for each different device $V_{OP}$. Groups of devices with similar $V_{OP}$ may share the same $V_{SUPPLY}$ in step 8.

In calculating Rs and $R_2$, the following steps are taken:

1. Choose the thermistor resistor $R_T$ (10 K ohms), (user would choose 2K, 5K, or 10K thermistor 2. Look at the Hamamatsu SiPM for the specified bias requirements ($V_{OP}$)

3. Then calculate the source resistor Rs, divider resistor $R_2$, and the $V_{OP}$ 4. Attach the SiPM to the module assuring thermal contact 5. Attach the module to the mother board 6. Place $R_{Lin}$, Rs and $R_2$ on the motherboard 7. Connect the $V_{SUPPLY}$ (bias supply voltage) to all the modules with the same $V_{SUPPLY}$ Note that granularity of available resistor values, the value tolerances and their temperature coefficients will limit the precision to which the ideal resistance values for $R_2$ and $R_S$ can be practically achieved. Additional resistors used in a trimming scheme will improve the precision but eventually the tolerance and temperature coefficient of the resistor values may dominate beyond trimming the 0.1% level. Estimates of the impacts of component values on circuit performance may be estimated using the following equations.

Sensitivity (V/Ω) of $V_{OP}$ to variation in $R_2$ is given by: (8)

$$\frac{dV}{dR_2} = \frac{V_{SUPPLY} - I_{Leak}\left[\frac{R_{Lin}U}{R_{Lin}+U}\right]}{R_2 + \left[\frac{R_{Lin}U}{R_{Lin}+U}\right]} - \frac{R_2\left[V_{SUPPLY} - I_{Leak}\left[\frac{R_{Lin}U}{R_{Lin}+U}\right]\right]}{\left[R_2 + \left[\frac{R_{Lin}U}{R_{Lin}+U}\right]\right]^2} \quad (8)$$

Where $U = R_{T_0} e^{B_0\left(\frac{1}{T}-\frac{1}{T_0}\right)}$

Sensitivity (V/Ω) of $V_{OP}$ to variation in $R_S$ is given by: (9)

$$\frac{dV}{dR_S} = \frac{I_{Leak}R_2}{R_2 + \left[\frac{R_{Lin}U}{R_{Lin}+U}\right]} - \frac{R_2\left[V_{SUPPLY} - I_{Leak}\left[\frac{R_{Lin}U}{R_{Lin}+U}\right]\right]}{\left[R_2 + \left[\frac{R_{Lin}U}{R_{Lin}+U}\right]\right]^2} \quad (9)$$

Where $U = R_{T_0} e^{B_0\left(\frac{1}{T}-\frac{1}{T_0}\right)}$

Sensitivity to the temperature coefficient of resistance for divider resistors (exclusive of the thermistor) can be mitigated by maintaining the temperature of the non-thermistor divider components stabilized to within a few degrees C.

Sensitivity to the change in device dark current (leakage) can be important in some applications, particularly where radiation damage can alter the dark rate.

To minimize the effect of changes in dark current on the set point voltage, the initial step of choosing the thermistor should include consideration not only of this additional current but also its change. Selecting a smaller value for the thermistor will increase the divider current (and divider dissipated power) but will make the impact of dark current and its changes much smaller.

Practical Example of the Invention

Select a set of Hamamatsu type S12572-010 SiPM devices with $V_{OP}$ (at 25° C.) ranging from 68.25 V to 70.00 V as specified by the manufacturer, available from Hamamatsu Corporation, Bridgewater, N.J., a bias compensation module is chosen with:

$R_T$=10K@25° C., $B_0$=3435K, Rtolerance=0.5%, B tolerance=0.5%

$R_{CL}$=10.0 KΩ 1% tolerance $C_F$=0.1 μF

The desired operating range is from 20° C. to 30° C.

Choose a design target point at 70% of the range=27.0° C. Performing the calculation first for the largest of the $V_{OP}$ values in the set of SiPMs gives the maximum $V_{SUPPLY}$ required. Ideal values are first calculated, after which practical values from available conventional resistance values are chosen to approximate the ideal values at several steps:

Calculate $R_{Lin}$(ideal)=9261 Ω choose $R_{Lin}$=9310 Ω1%

Continue the design process starting with the largest $V_{OP}$ (25 C). In this example 70.0 V. Note that at the 27.0° C. design target point the $V_{OP}$ is then 70.112 V The nominal TCV for the Hamamatsu device is 56 mV/K, but if a 7% smaller TCV is used in the calculations at the upper end of $V_{OP}$ range there is an increased range of operable temperatures. We use 52 mV/K to calculate the R2 value for the largest $V_{OP}$ of the set of SiPMs.

Calculate R2(ideal)=119653.6 Ω

Calculate $V_{SUPPLY}$(ideal)=72.8010

Choose $V_{SUPPLY}$=73.0 V and

Choose R2=100 KΩ (0.1%)+19.6 KΩ 1%=119600 Ω

Calculate Rs(ideal)=339.54; and

Choose Rs=324 Ω 1% from available conventional resistance values to approximate the ideal value of Rs This completes the set of values for the largest $V_{OP}$ among the set of SiPMs. This establishes the value of $V_{SUPPLY}$ necessary to be shared among all SiPMs. For the smallest $V_{OP}$ of the SiPMs, better matching is achieved with a 7% larger TCV, so we choose 60 mV/K to calculate R2 (ideal)=98,552.5Ω and with $V_{SUPPLY}$=73.0 V then R2=97.6 KΩ 0.1%+887 Ω 1%=98487Ω, Rs (ideal) is then calculated as Rs(ideal)=2094.5Ω, and choose R2=2100Ω This allows all SiPMs to share the same $V_{SUPPLY}$ voltage. Each of the other SiPM voltages between these two limits has its own set of values for R2 and Rs.

Figure 6:
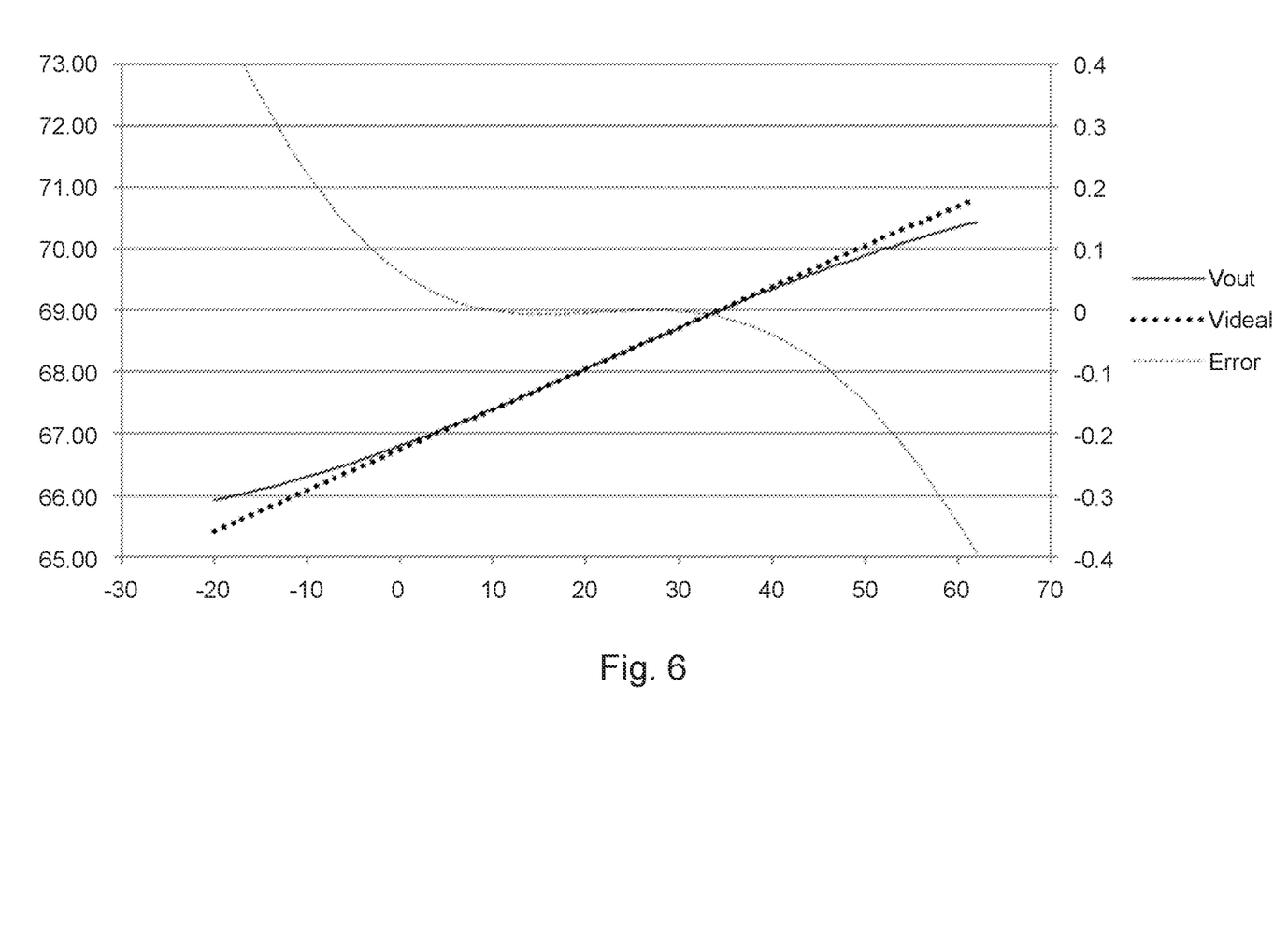
FIG. 6 shows the calculated output of a passive compensation circuit plotted with ideal compensation and error illustrating the region over which compensation matches ideal. In this example the output voltage in the region from 12° C. to 33° C. is within +/−5 mV of ideal.

With reference to FIG. 6, the design is checked by calculations using the chosen values for $R_{Lin}$, $V_{SUPPLY}$, R2 and Rs. Calculations checking the results of the voltage tracking for this design suggest that the bias voltages at the SiPM remain within 25 mV of ideal over a temperature range of 10° C. to 35° C.

Figure 7:
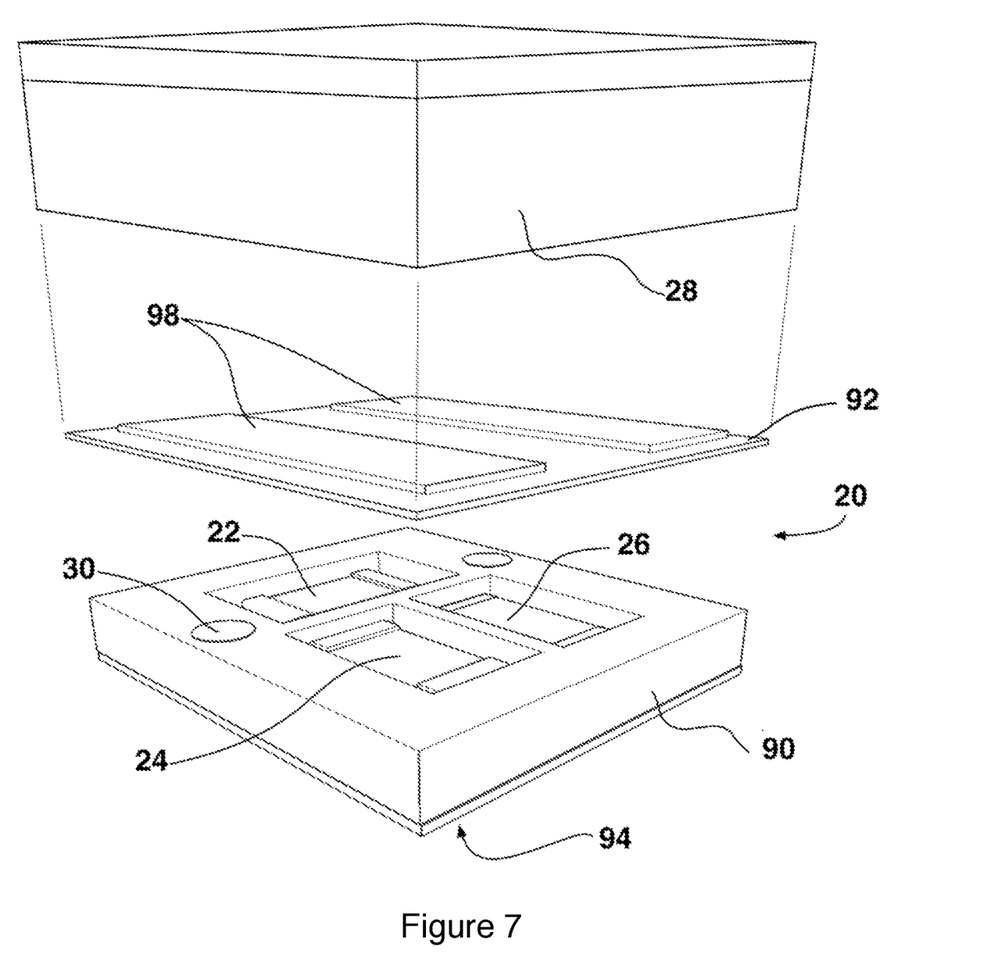
FIG. 7 is an exploded isometric view depicting a thermally-compensated SiPM module using embedded component PCB fabrication techniques.

Referring to FIG. 7, there is shown a method for constructing a thermally-compensated SiPM module 20 according to the invention using embedded component PCB fabrication techniques to produce a thin (~1 mm) module 20. The thermally-compensated SiPM module 20 includes a PCB body 90 with a top surface 92, and a bottom layer 94. The PCB body 90 includes two anode/cathode contacts 30 which connect to the top layer 92. The four bottom contacts on the underside of the bottom surface are not shown. The outline of the module 20 is constructed to match the outline of the SiPM sensor 28, thus requiring no additional PCB area and allowing close spacing of detector elements. The thermistor 22, current limiting resistor 24, and filter capacitor 26 are mounted under the top layer 92 and in thermal contact with the SiPM through the top layer. During fabrication the top layer 92 is then secured to the PCB body 90 thereby embedding the electrical components 22, 24, and 26 in the PCB body 90. Two lands 98 are provided on the top layer 92 for the SiPM connection. The embedded PCB technique ensures that the thermal sensor or thermistor 22 is in intimate thermal contact with the SiPM 28. Additionally the embedded PCB construction provides moderate thermal isolation between the SiPM and the motherboard (not shown). The fully assembled embedded PCB or wafer is a thin (~1 mm) module 20 with two contacts 98 on the top of the module for connection of the SiPM 28 and four leadless contacts 32 (see FIG. 2) on the bottom of the module 20.

Although the description above contains various specific descriptions, materials, methods and dimensions, these should not be construed as limiting the scope of the invention but as merely providing illustrations of some of the presently preferred embodiments of this invention. Thus the scope of the invention should be determined by the appended claims and their legal equivalents, rather than by the examples given.

What is claimed is:

1. A method for providing a passive bias temperature compensation module for a photodetector having a specified bias requirement, comprising:
    selecting a thermistor resistor;
    calculating, based on the desired operating temperature and the specified bias requirement of the photodetector, a value for a linearizing resistor, a source resistor, a divider resistor, and a bias supply voltage;
    attaching the thermistor resistor to the module in thermal contact with the photodetector;
    attaching the module to a motherboard;
    mounting the linearizing resistor, source resistor and the divider resistor on the motherboard;
    connecting a bias supply voltage to all photodetectors having the same bias requirement;
    a PCB body, a bottom layer, and a top layer; and
    said thermistor resistor is contained within said PCB body by said top layer and said bottom layer.

2. The method of claim 1 further comprising:
    attaching a current limiting resistor to the module connected to the thermistor resistor; and
    attaching a filter capacitor to the module.

3. The method of claim 1 wherein the passive bias temperature compensation module provides thermal isolation between the photodetector and the motherboard.

4. A passive bias temperature compensation module for a photodetector having a specified bias requirement, comprising:
    a thermistor resistor on said module, said thermistor resistor in thermal contact with the photodetector;
    a filter capacitor and a current limiting resistor on said module;
    a motherboard in thermal isolation from said module;
    a linearizing resistor and a divider resistor on the motherboard;
    a bias supply voltage connected to the motherboard;
    a source resistor on said motherboard;
    a PCB body, a bottom layer, and a top layer; and
    said thermistor resistor is embedded within said PCB body by said top layer and said bottom layer.

5. The passive bias temperature compensation module of claim 4 further comprising an anode-cathode in land and an anode-cathode out land on said top layer of said module.

6. The passive bias temperature compensation module of claim 5 further comprising a first contact extending from said top layer and electrically connecting said anode-cathode in land with said photodetector.

7. The passive bias temperature compensation module of claim 6 further comprising a second contact extending from said top layer and electrically connecting said anode-cathode out land with said photodetector.

8. The passive bias temperature compensation module of claim 7 further comprising:
    a divider out connection to said thermistor resistor and to said current limiting resistor; and
    said divider out connection on said bottom layer of said module.

9. The passive bias temperature compensation module of claim 8 further comprising:
    a ground connection to said filter capacitor; and
    said ground connection on said bottom layer of said module and connected to said filter capacitor.

10. The passive bias temperature compensation module of claim 4 wherein said PCB body, said top layer, and said bottom layer form an embedded component PCB.

* * * * *